(12) United States Patent
Komatsu et al.

(10) Patent No.: US 11,198,933 B2
(45) Date of Patent: Dec. 14, 2021

(54) METHOD OF MANUFACTURING SPUTTERING TARGET AND SPUTTERING TARGET

(71) Applicants: KABUSHIKI KAISHA TOSHIBA, Tokyo (JP); TOSHIBA MATERIALS CO., LTD., Yokohama (JP)

(72) Inventors: Tooru Komatsu, Kanagawa (JP); Nobuaki Nakashima, Kanagawa (JP)

(73) Assignees: KABUSHIKI KAISHA TOSHIBA, Tokyo (JP); TOSHIBA MATERIALS CO., LTD., Yokohama (JP)

(*) Notice: Subject to any disclaimer, the term of this patent is extended or adjusted under 35 U.S.C. 154(b) by 0 days.

(21) Appl. No.: 16/713,957

(22) Filed: Dec. 13, 2019

(65) Prior Publication Data

US 2020/0115790 A1    Apr. 16, 2020

Related U.S. Application Data

(60) Division of application No. 15/271,911, filed on Sep. 21, 2016, now Pat. No. 10,533,248, which is a continuation of application No. PCT/JP2015/001827, filed on Mar. 30, 2015.

(30) Foreign Application Priority Data

Mar. 31, 2014    (JP) ................. 2014-073960

(51) Int. Cl.
| | |
|---|---|
| *C23C 14/34* | (2006.01) |
| *C23G 1/02* | (2006.01) |
| *H01J 37/34* | (2006.01) |
| *B22D 7/00* | (2006.01) |
| *C22F 1/10* | (2006.01) |
| *C22F 1/18* | (2006.01) |
| *C23C 14/14* | (2006.01) |
| *C23G 1/10* | (2006.01) |

(52) U.S. Cl.
CPC .......... *C23C 14/3414* (2013.01); *B22D 7/005* (2013.01); *C22F 1/10* (2013.01); *C22F 1/18* (2013.01); *C22F 1/183* (2013.01); *C23C 14/14* (2013.01); *C23G 1/02* (2013.01); *C23G 1/10* (2013.01); *C23G 1/106* (2013.01); *H01J 37/3426* (2013.01); *H01J 37/3491* (2013.01)

(58) Field of Classification Search
CPC .. C23C 14/3414; C23C 14/14; H01J 37/3426; C23G 1/106; C23G 1/10; C22F 1/18; C22F 1/10; C22F 1/183
See application file for complete search history.

(56) References Cited

U.S. PATENT DOCUMENTS

| | | | |
|---|---|---|---|
| 5,458,697 | A | 10/1995 | Ishigami et al. |
| 6,497,797 | B1 * | 12/2002 | Kim .................. C23C 14/3407 204/192.1 |
| 2002/0170389 | A1 | 11/2002 | McTiernan et al. |
| 2005/0029094 | A1 | 2/2005 | Watanabe et al. |
| 2007/0215463 | A1 | 9/2007 | Parkhe |
| 2012/0267236 | A1 | 10/2012 | Nakashima et al. |

FOREIGN PATENT DOCUMENTS

| | | | | |
|---|---|---|---|---|
| EP | 0834594 | A1 * | 4/1998 | ......... C23C 14/3414 |
| JP | 08-53756 | A | 2/1996 | |
| JP | 2000-239837 | A | 9/2000 | |
| JP | 2001-335923 | A | 12/2001 | |
| JP | 2002-060934 | A | 2/2002 | |
| JP | 2002-339032 | A | 11/2002 | |
| JP | 2003-049264 | A | 2/2003 | |
| JP | 2005-023349 | A | 1/2005 | |
| JP | 2005-023350 | A | 1/2005 | |
| JP | 2007-247061 | A | 9/2007 | |
| WO | WO 2011/061897 | A1 | 5/2011 | |
| WO | WO 2012/144407 | A1 | 10/2012 | |

OTHER PUBLICATIONS

U.S. Notice of Allowance on U.S. Appl. No. 16/713,978 dated Oct. 1, 2021.

* cited by examiner

*Primary Examiner* — Jessee R Roe

(74) *Attorney, Agent, or Firm* — Foley & Lardner LLP

(57) ABSTRACT

The manufacturing cost of a sputtering target is reduced and the impurity concentration of the manufactured sputtering target is also reduced. A method of manufacturing a sputtering target includes: surface-treating at least one of a used sputtering target and a scrap material; melting at least one of the used sputtering target and the scrap material after the surface treatment to form an ingot; and manufacturing a sputtering target by subjecting the ingot to forging, rolling, heat treating, and machining.

6 Claims, 2 Drawing Sheets

METHOD OF MANUFACTURING SPUTTERING TARGET AND SPUTTERING TARGET

CROSS REFERENCE TO RELATED APPLICATION

This application is a divisional of U.S. patent application Ser. No. 15/271,911, now U.S. Pat. No. 10,533,248, filed on Sep. 21, 2016, which is a continuation of prior International Application No. PCT/JP2015/001827 filed on Mar. 30, 2015, which is based upon and claims the benefit of priority from Japanese Patent Application No. 2014-073960 filed on Mar. 31, 2014; the entire contents of all of which are incorporated herein by reference.

FIELD

Embodiments described herein relate generally to a method of manufacturing a sputtering target and a sputtering target.

BACKGROUND

In the manufacture of semiconductor components or liquid-crystal components, a sputtering apparatus is used to form various kinds of wiring and electrodes. For example, various kinds of metal thin films and intermetallic compound thin films are formed on a film-formation substrate such as a semiconductor substrate and a glass substrate by a sputtering method. The aforesaid thin films are used as, for example, a wiring layer, an electrode layer, a barrier layer, a foundation layer (a liner material), and the like. Impurities in the thin films have an adverse effect on operation reliability of semiconductor devices. For this reason, a high purity of 4 N or more is required of sputtering targets used for forming the thin films.

Metal materials used as sputtering targets are manufactured by, for example, a sintering method or a melting method. In the manufacture of the above metal materials, their raw materials are refined for reducing impurities. An ingot is formed from the above material whose impurities are reduced. The ingot is worked by forging, rolling, and so on to be formed into a billet. The billet is heat-treated for its structure control and so on. The billet is further shaped to a predetermined size by machining and the resultant billet is bonded to a cooling backing plate as required, and as a result, it is possible to manufacture the sputtering target.

As wafers and the like become larger, larger sputtering targets are required. In conventional methods of manufacturing sputtering targets, the increase of the target size inevitably increases manufacturing cost.

DETAILED DESCRIPTION

Figure 1:
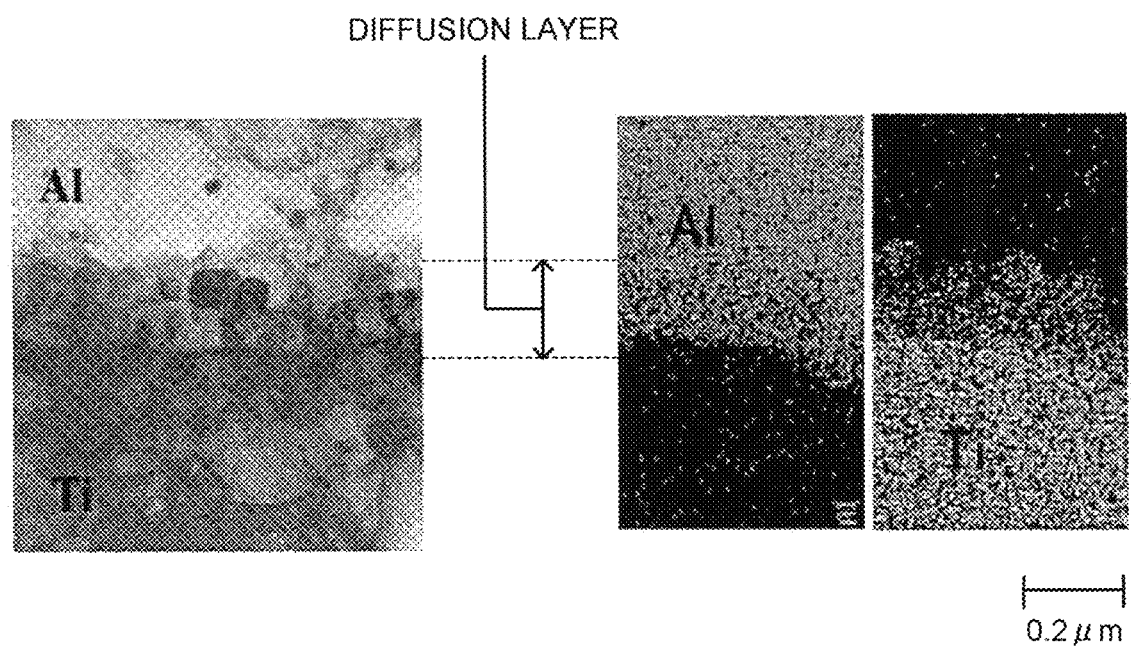
FIG. 1 is a view illustrating an electron micrograph of a bonding interface between a sputtering target and a backing plate and component distribution in the same.

A method of manufacturing a sputtering target of this embodiment includes: surface-treating at least one of a used sputtering target including a first face and a scrap material including a second face to expose at least one of the first and second faces and remove at least one of a part of the used sputtering target and a part of the scrap material by 1 mm or more in an inward direction from the first and second faces, the used sputtering target and the scrap material each containing a metal element, and the first and second faces each having uniform metallic color; melting at least one of the used sputtering target and the scrap material after the surface treatment to form an ingot; and manufacturing a sputtering target by subjecting the ingot to forging, rolling, heat treating, and machining. The sputtering target produced by the manufacturing method has purity equal to or higher than that of the used sputtering target or the scrap material.

The used sputtering target contains at least one metal element out of Ti, Zr, V, Nb, Ta, Cr, Mo, W, Co, Ir, Ni, Pd, and Pt. To fabricate the aforesaid used sputtering target a used sputtering target with a diffusion-bonded backing plate, a used sputtering target with a solder-bonded backing plate, a used sputtering integrated target without a backing plate, or the like is used, for instance.

In the case where the used sputtering target including the backing plate is used, the backing plate is removed by, for example, cutting or heat treatment, whereby the aforesaid used sputtering target is prepared.

The scrap material contains the aforesaid metal element of the used sputtering target. Examples of the scrap material include a scrap of an ingot, a scrap of a billet, cutting chips, and other scraps from a manufacturing process of the sputtering target.

Incidentally, at least one of the used sputtering target and the scrap material may be machined or cut. After it is worked into a small piece having a length and a width of, for example, 150 mm or less by the machining or the cutting, the small piece may be surface-treated. The small piece, if having a length and a width of more than 150 mm, is difficult to supply when it is to be melted.

In the surface treatment, surface impurities adhering to at least one of the surface of the used sputtering target and the surface of the scrap material are removed. The surface treatment is performed using at least one of pickling removal and mechanical removal, for instance. The pickling removal is performed using a mixture containing two acids or more out of hydrofluoric acid, nitric acid, hydrochloric acid, and acetic acid, for instance. Two acids or more are mixed for the treatment, since the use of one acid has only a small effect of the impurity removal from the surface, resulting in a long removal time.

Preferably, for example, the pickling removal is performed for a one to thirty minute cleaning time with a solution containing hydrofluoric acid, hydrochloric acid, and water whose mixture ratios are 7%, 3%, and 90% respectively, or for a one to thirty minute cleaning time with a solution containing hydrofluoric acid, nitric acid, and acetic acid whose mixture ratios are 25%, 50%, and 25% respectively. Further, in mass production, the pickling removal is preferably performed for a one to thirty minute cleaning time with a solution containing nitric acid, hydrofluoric acid, and water whose mixture ratios are 67%, 10%, and 23% respectively. That is, the pickling removal is preferably performed using a mixture of hydrofluoric acid having a first mixture ratio and nitric acid having a second mixture ratio higher than the first mixture ratio. The impurities can be removed even when the mixture ratios are not as stated above, but when the contents of the acids are less than these ratios, the cleaning time becomes long, which is not suitable for mass production.

In the surface treatment, the face having uniform metallic color in at least one of the used sputtering target and the scrap material is exposed. Further, at least one of part of the used sputtering target and part of the scrap material is removed by 1 mm or more in the inward direction from the exposed face. If the removed part is less than 1 mm, an impurity diffusion layer on the surface of, for example, the used sputtering target cannot be sufficiently removed.

FIG. 1 is a view illustrating an electron micrograph of a bonding interface between a sputtering target and a backing plate and component distribution in the same. An area where the component distribution of Ti and the component distribution of Al overlap with each other is the diffusion layer.

In the used sputtering target with the backing plate, even if the surface appears to have uniform metallic color and thus to be made up of a single metal when visually observed, the element (A1) forming the backing plate material diffuses also to the Ti sputtering target side in the bonding interface as illustrated in FIG. 1. An effective way to remove impurities including the above diffusion area is surface treatment to remove at least one of part of the used sputtering target and part of the scrap material by 1 mm or more in the inward direction from the face having uniform metallic color.

Similarly, as for the contamination by impurities such as a surface oxide, the surface, even if having uniform metallic color when visually observed, sometimes has a part where the impurities are diffused. In the above case, it is preferable to remove at least one of part of the used sputtering target and part of the scrap material by 1 mm or more in the inward direction from the face having uniform metallic color.

By removing the impurities adhering or diffused to the used sputtering target and the scrap material by at least one method or more out of the pickling removal and the mechanical removal, it is possible to reduce an influence of the contamination of the sputtering target by iron and oxygen especially when the sputtering target is used in a sputtering apparatus and an influence of the contamination of the used sputtering target by the backing plate (mainly an aluminum alloy).

In the step of melting at least one of the used sputtering target and the scrap material, at least one of, for example, electron-beam melting, plasma-arc melting, and cold crucible induction melting is used to melt at least one of the used sputtering target and the scrap material. This further reduces the impurities contained in the used sputtering target and the scrap material, making it possible for the manufactured sputtering target to have purity equal to or higher than that of the used sputtering target.

In the electron-beam melting or the cold crucible induction melting, at least one of the used sputtering target and the scrap material is melted, preferably under a $1.0 \times 10^{-1}$ Pa degree of vacuum or less. When the degree of vacuum is over $1.0 \times 10^{-1}$ Pa, electron beams are not sufficiently generated and moved, which is not suitable for the melting. The degree of vacuum is more preferably $6.5 \times 10^{-3}$ Pa or less. If the used sputtering target and/or the scrap material are melted under the above degree of vacuum, the surface thereof can be heated at high temperature, which enables degassing and refining simultaneously with the melting. Further, the above melting method uses a water-cooling copper crucible and thus is less likely to cause a reaction with a furnace material and the contamination by a furnace material.

In the method of manufacturing the sputtering target of this embodiment, the forging, the rolling, the heat treating, and the machining are preferably repeated, for instance.

The purpose of the forging is to deform a cast structure of the ingot having been melted, by the working and cause crystal grains to be oriented randomly at the time of recrystallization caused by the later heat treatment. A reduction in area by the forging is preferably 40% or more. When it is less than 40%, a metallic structure of the billet may not deform sufficiently. Further, the cast structure may remain due to the insufficient forging.

When the cast structure remains, the crystal grains are likely to be oriented in a specific direction at the time of the recrystallization after the heat treatment. As a result, a crystal after the heat treatment does not become fine and it may not be possible to obtain the random orientation of the crystal grains suitable for the sputtering.

The impurities, if reduced, are not likely to hinder the movement of grain boundaries of the crystal grains in the heat treatment in the manufacturing process of the sputtering target. As a result, it is possible to obtain the random orientation in the manufactured sputtering target.

The above-described manufacturing method can reduce the influence of the contamination of the used sputtering target by iron and oxygen due to, for example, the sputtering apparatus or the like and the influence of the contamination of the used sputtering target by the backing plate (mainly consisting of an aluminum alloy or a copper alloy).

The sputtering target produced by the above-described manufacturing method contains the aforesaid metal element. Further, in the sputtering target produced by the above-described manufacturing method, oxygen amounts in the surface and the thickness direction of the sputtering target can be 200 ppm or less. Iron amounts in the surface and the thickness direction of the sputtering target can be 10 ppm or less. Aluminum amounts in the surface and the thickness direction of the sputtering target can be 10 ppm or less. Copper amounts in the surface and the thickness direction of the sputtering target can be 5 ppm or less.

The oxygen amounts in the surface and the thickness direction of the sputtering target can be within a range of +30% or less with respect to an average value of an oxygen amount in the entire sputtering target. The iron amounts in the surface and the thickness direction of the sputtering target can be within a range of +30% or less with respect to an average value of an iron amount in the entire sputtering target. The aluminum amounts in the surface and the thickness direction of the sputtering target can be within a range of +40% or less with respect to an average value of an aluminum amount in the entire sputtering target. The copper amounts in the surface and the thickness direction of the sputtering target can be within a range of +40% or less, preferably +30% or less with respect to an average value of a copper amount in the entire sputtering target.

Figure 2:
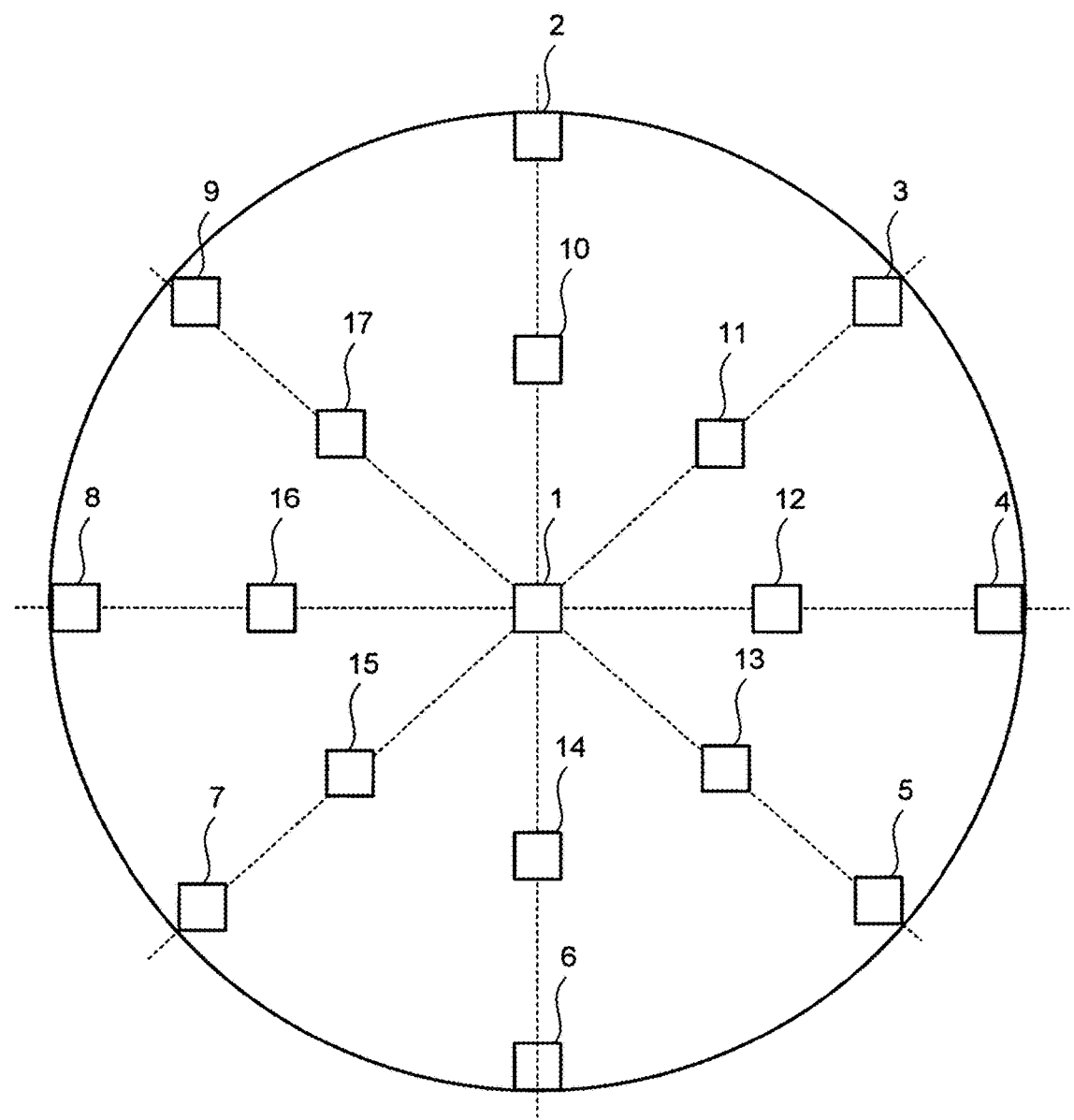
FIG. 2 is a top view illustrating measurement positions in a surface and a thickness direction of the sputtering target.
Figure 3:
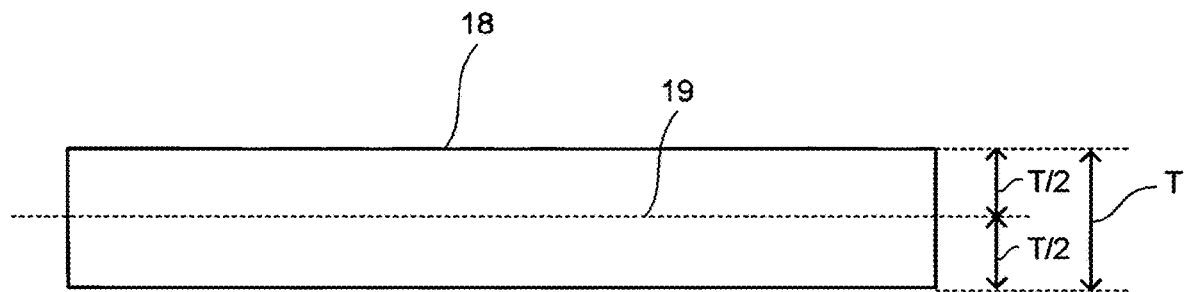
FIG. 3 is a side view illustrating thickness-direction measurement positions of the sputtering target.

The oxygen amounts, the iron amounts, and the aluminum amounts in the surface and the thickness direction of the sputtering target are measured as follows. FIG. 2 is a top view illustrating measurement positions in the surface and the thickness direction of the sputtering target, and FIG. 3 is a side view illustrating thickness-direction measurement positions of the sputtering target.

As illustrated in FIG. 2, in the surface of the target in a disk shape, for example, totally 17 samples are collected at a center portion (position 1), outer periphery vicinity positions (positions 2 to 9) on four straight lines which pass the center portion and equally divide the circumference, and ½ distance positions (positions 10 to 17) on the four straight lines. Further, as illustrated in FIG. 3, in a plane (position 19) at a ½ (T/2) position of the whole thickness T of the sputtering target, totally 17 samples are collected at the same positions (positions 1 to 17) as those in the surface (position 18). From analysis values of these 34 samples, the oxygen amounts, the iron amounts, and the aluminum amounts in the surface and the thickness direction of the sputtering target are found.

For X-ray diffraction measurement in the surface and the thickness direction of the sputtering target, for example, 17 samples at the positions 1 to 17 in the surface (position 18) and totally 17 samples at the positions 1 to 17 in the plane (position 19) at the ½ (T/2) position of the whole thickness T of the sputtering target are collected, similarly to the aforesaid analysis samples.

In X-ray diffraction patterns obtained from the X-ray diffraction measurement of the above 34 samples, when the combination of a first crystal plane having the highest peak intensity, a second crystal plane having the second highest peak intensity, and a third crystal plane having the third highest peak intensity are the same as the combination of the first crystal plane, the second crystal plane, and the third crystal plane in Powder Diffraction File which is data on X-ray diffraction peak intensity of powder that is an assembly of random crystals, it is indicated that the measured sputtering target has a random orientation.

As described above, in this embodiment, it is possible to reduce the manufacturing cost of the sputtering target and also reduce the impurities in the sputtering target.

Another known method to reduce the manufacturing cost of a sputtering target is, for example, a method of manufacturing a sputtering target by depositing raw material powder on a substrate by a thermal spraying method or the like. The use of the thermal spraying method can reduce the manufacturing cost of the sputtering target.

The manufacturing method using the thermal spraying method, however, has not been put into practical use as a method of manufacturing a sputtering target. One reason for this is that the thermal spraying has a difficulty in increasing the density of a deposited film. Another problem is that a gas component in the target increases, since the raw material powder is deposited while being melted in the atmosphere. Because of these, there occurs a serious problem that abnormal discharge occurs many times to increase the number of generated particles.

In a sputtering target used for forming a liquid-crystal component, in accordance with an increase of the target size, it is required to prevent splash, which is generated due to a defect, and an increase of particles ascribable to the splash. In semiconductor devices, a wiring width is being narrowed (for example, 0.13 μm 0.09 μm and further 0.065 μm or less) in order to achieve a high integration degree. Even particles whose diameter is as small as, for example, about 0.2 μm, if contaminated in the narrowed wiring and the semiconductor device having such wiring, cause a wiring failure, an element failure, and so on. So, it is desired to prevent the generation of the aforesaid particles. The method of manufacturing the sputtering target using the thermal spraying method cannot meet such a requirement at all.

On the other hand, in the manufacture of a sputtering target by recovering and melting a used sputtering target, if the used sputtering target that is a high-purity sputtering target is melted, a plurality of refining processes can be needless. This enables a reduction in the manufacturing cost of, for example, a large-sized sputtering target. A sputtering target manufactured from a recycled used sputtering target may be usually lower in purity than the original used sputtering target. This is because impurities are contaminated in the step of melting the used sputtering target and the contaminated impurities cannot be removed or reduced.

The sputtering target and the method of manufacturing the sputtering target of this embodiment can omitt the plural refining processes. This can reduce the manufacturing cost of a large-sized sputtering target. Further, by recycling a used sputtering target or a scrap material produced in a process of manufacturing the sputtering target, it is possible to reduce the manufacturing cost of a large-sized target and so on. Impurities in the sputtering target can also be reduced.

The embodiments of the present invention have been presented by way of example only, and are not intended to limit the scope of the inventions. The novel embodiments described herein may be embodied in a variety of other forms; furthermore, various omissions, substitutions and changes may be made without departing from the spirit of the inventions. The inventions described in the accompanying claims and their equivalents are intended to cover such embodiments or modifications as would fall within the scope and spirit of the inventions.

EXAMPLES

Example 1

From a recovered used Ti target with an Al-alloy (A6061) backing plate, the backing plate was removed by cutting. At the time of the removal of the backing plate, after a surface of a target material was exposed and came to have uniform metallic color, cutting of 1 mm or more was performed. The targets from which the backing plate were removed and the scrap material were each cut to about 100 mm width. Their cut pieces were pickled for ten minutes with a mixed solution of 25% hydrofluoric acid, 50% nitric acid, and 25% acetic acid, and further after the surface came to have uniform metallic color, the cut pieces were partly removed by 1 mm or more by the same pickling. These materials were subjected to electron-beam melting, and an ingot having 350 mm diameter was fabricated. This ingot was subjected to forging with 60% reduction of area and thereafter heat-treated. Then, continually this ingot was worked to 8 mm thickness by rolling and was primarily machined by cutting, and thereafter the target material was diffusion-bonded to an Al-alloy (A6061) backing plate. As finish machining, cutting was performed to fabricate a target.

Comparative Example 1

This is the used Ti target used in the example 1.

Example 2

From a recovered used Ta target with a Cu-alloy (brass) backing plate, the backing plate was removed by cutting. At the time of the removal of the backing plate, after a surface of a target material was exposed and came to have uniform metallic color, cutting of 1 mm or more was performed. The targets from which the backing plate were removed and the scrap material were each cut to about 100 mm width. Their cut pieces were pickled for ten minutes with a mixed solution of 67% nitric acid, 10% hydrofluoric acid, and 23% water, and further after the surface came to have uniform metallic color, the cut pieces were partly removed by 1 mm or more by the same pickling. These materials were subjected to electron-beam melting, and an ingot having 135 mm diameter was fabricated. This ingot was subjected to forging with 45% reduction of area and thereafter heat-treated. Then, continually this ingot was worked to 12 mm thickness by rolling and was primarily machined by cutting, and thereafter the target material was diffusion-bonded to a Cu-alloy (brass) backing plate. As finish machining, cutting was performed to fabricate a target.

Comparative Example 2

This is the used Ta target used in the example 2.

Example 3

From a recovered used Ni target with an Al-alloy (A6061) backing plate, the backing plate was removed by heat treatment. The targets from which the backing plate were removed and the scrap material were each cut to about 100 mm width. Their cut pieces were pickled for thirty minutes with a mixed solution of 67% nitric acid, 10% hydrofluoric acid, and 23% water, and further after the surface came to have uniform metallic color, the cut pieces were partly removed by 1 mm or more by the same pickling. These materials were subjected to electron-beam melting, and an ingot having 135 mm diameter was fabricated. This ingot was subjected to forging with 70% reduction of area and thereafter heat-treated. Then, continually this ingot was worked to 5 mm thickness by rolling and was primarily machined by cutting, and thereafter, the target material was bonded to an Al-alloy (A6061) backing plate by In soldering. As finish machining, cutting was performed to fabricate a target.

Comparative Example 3

This is the used Ni target used in the example 3.

Example 4

From the Ti target with the Al-alloy (A6061) backing plate which was fabricated in the example 1 and was used, the backing plate was removed by cutting. At the time of the removal of the backing plate, after a surface of a target material was exposed and came to have uniform metallic color, cutting of 1 mm or more was performed. The targets from which the backing plate were removed and the scrap material were each cut to about 100 mm width. Their cut pieces were pickled for ten minutes with a mixed solution of 25% hydrofluoric acid, 50% nitric acid, and 25% acetic acid, and further after the surface came to have uniform metallic color, the cut pieces were partly removed by 1 mm or more by the same pickling. These materials were subjected to electron-beam melting, and an ingot having 350 mm diameter was fabricated. This ingot was subjected to forging with 60% reduction of area and thereafter heat-treated. Then, continually this ingot was worked to 8 mm thickness by rolling and was primarily machined by cutting, and thereafter the target material was diffusion-bonded to an Al-alloy (A6061) backing plate. As finish machining, cutting was performed to fabricate a target.

Example 5

From the Ti target with the Al-alloy (A6061) backing plate which was fabricated in the example 4 and was used, the backing plate was removed by cutting. At the time of the removal of the backing plate, after a surface of a target material was exposed and came to have uniform metallic color, cutting of 1 mm or more was performed. The targets from which the backing plate were removed and the scrap material were each cut to about 100 mm width, and their cut pieces were pickled for ten minutes with a mixed solution of 25% hydrofluoric acid, 50% nitric acid, and 25% acetic acid. These materials were subjected to electron-beam melting, and an ingot having 350 mm diameter was fabricated. This ingot was subjected to forging with 60% reduction of area and thereafter heat-treated. Then, continually this ingot was worked to 8 mm thickness by rolling and was primarily machined by cutting, and thereafter the target material was diffusion-bonded to an Al-alloy (A6061) backing plate. As finish machining, cutting was performed to fabricate a target.

Comparative Example 4

From a used Ti target with an Al-alloy (A6061) backing plate which was the same as that of the example 1, the backing plate was removed by cutting. At the time of the removal of the backing plate, the cutting was finished when the surface of a target material was exposed and came to have uniform metallic color. The targets from which the backing plate were removed and the scrap material were each cut to about 100 mm width. Their cut pieces were subjected to electron-beam melting without being pickled, and an ingot having 350 mm diameter was fabricated. This ingot was subjected to forging with 60% reduction of area and thereafter heat-treated. Then, continually this ingot was worked to 8 mm thickness by rolling and was primarily machined by cutting, and thereafter the target material was diffusion-bonded to an Al-alloy (A6061) backing plate. As finish machining, cutting was performed to fabricate a target.

Component analysis of iron, copper, aluminum, and oxygen was performed using totally 34 samples collected from each of the sputtering targets according to the examples 1 to 5 and the comparative examples 1 to 4 at the aforesaid positions 1 to 17 in the surface and the plane at the ½ position of the whole thickness. Tables 1 to 16 present results of their analysis values.

Further, X-ray diffraction measurement was conducted using totally 34 samples collected from each of the sputtering targets at the aforesaid positions 1 to 17 in the surface and the plane at the ½ position of the whole thickness, and the order of peak intensities in major crystal planes was investigated from obtained X-ray diffraction patterns. Tables 17 and 18 present their results.

Table 1 presents iron amounts (ppm) in the surface of each of the targets.

TABLE 1

| Material | Example 1 Ti | Example 2 Ta | Example 3 Ni | Example 4 Ti | Example 5 Ti | Comp. Example 1 Ti | Comp. Example 2 Ta | Comp. Example 3 Ni | Comp. Example 4 Ti |
|---|---|---|---|---|---|---|---|---|---|
| 1 | 4.7 | 0.24 | 1.4 | 5.2 | 4.4 | 5.2 | 0.22 | 1.6 | 9.2 |
| 2 | 4.4 | 0.28 | 1.6 | 4.5 | 5.1 | 4.1 | 0.42 | 1.5 | 8.5 |
| 3 | 5.3 | 0.25 | 1.3 | 4.8 | 4.7 | 4.8 | 0.47 | 1.3 | 7.5 |
| 4 | 4.7 | 0.26 | 1.3 | 5.9 | 4.5 | 5.8 | 0.28 | 1.4 | 7.1 |
| 5 | 5.1 | 0.23 | 1.4 | 5.3 | 5.3 | 6.6 | 0.34 | 1.3 | 9.7 |
| 6 | 4.5 | 0.20 | 1.5 | 5.8 | 4.5 | 5.7 | 0.23 | 1.3 | 11.4 |
| 7 | 4.1 | 0.26 | 1.4 | 5.9 | 5.1 | 6.5 | 0.35 | 1.4 | 6.6 |
| 8 | 5.5 | 0.19 | 1.6 | 4.7 | 5.3 | 5.6 | 0.27 | 1.5 | 6.7 |
| 9 | 5.3 | 0.27 | 1.3 | 4.7 | 5.8 | 5.5 | 0.34 | 1.4 | 10.8 |
| 10 | 5.0 | 0.28 | 1.3 | 4.6 | 5.2 | 5.5 | 0.31 | 1.5 | 7.5 |
| 11 | 4.9 | 0.26 | 1.4 | 4.8 | 5.8 | 6.0 | 0.29 | 1.6 | 11 |
| 12 | 4.2 | 0.21 | 1.5 | 4.4 | 4.1 | 6.0 | 0.27 | 1.7 | 9.2 |
| 13 | 4.3 | 0.26 | 1.2 | 3.6 | 5.8 | 5.9 | 0.25 | 1.3 | 11 |
| 14 | 3.9 | 0.28 | 1.3 | 4.8 | 4.9 | 5.2 | 0.31 | 1.3 | 8.9 |
| 15 | 4.2 | 0.23 | 1.5 | 4.8 | 4.0 | 4.9 | 0.23 | 1.4 | 8.5 |
| 16 | 3.9 | 0.27 | 1.6 | 5.2 | 4.5 | 5.6 | 0.32 | 1.2 | 13.4 |
| 17 | 5.1 | 0.24 | 1.3 | 5.5 | 4.7 | 5.8 | 0.41 | 1.4 | 7.4 |
| ave. | 4.7 | 0.25 | 1.4 | 5.0 | 4.9 | 5.6 | 0.3 | 1.4 | 9.1 |

Table 2 presents a ratio (%) of a value equal to the iron amount at each of the positions from which an overall average value of the iron amount is subtracted, to the overall average value, in the surface of the target.

TABLE 2

| Material | Example 1 Ti | Example 2 Ta | Example 3 Ni | Example 4 Ti | Example 5 Ti | Comp. Example 1 Ti | Comp. Example 2 Ta | Comp. Example 3 Ni | Comp. Example 4 Ti |
|---|---|---|---|---|---|---|---|---|---|
| 1 | 1% | −3% | 0% | 5% | −11% | −7% | −30% | 13% | 1% |
| 2 | −5% | 13% | 14% | −9% | 4% | −26% | 34% | 6% | −6% |
| 3 | 14% | 1% | −8% | −3% | −5% | −14% | 50% | −8% | −17% |
| 4 | 1% | 5% | −8% | 19% | −9% | 4% | −10% | −1% | −22% |
| 5 | 10% | −7% | 0% | 7% | 8% | 18% | 9% | −8% | 7% |
| 6 | −3% | −19% | 7% | 17% | −9% | 2% | −26% | −8% | 26% |
| 7 | −12% | 5% | 0% | 19% | 4% | 17% | 12% | −1% | −27% |
| 8 | 18% | −23% | 14% | −5% | 8% | 1% | −14% | 6% | −26% |
| 9 | 14% | 9% | −8% | −5% | 18% | −1% | 9% | −1% | 19% |
| 10 | 7% | 13% | −8% | −7% | 6% | −1% | −1% | 6% | −17% |
| 11 | 5% | 5% | 0% | −3% | 18% | 8% | −7% | 13% | 21% |
| 12 | −10% | −15% | 7% | −11% | −17% | 8% | −14% | 20% | 1% |
| 13 | −8% | 5% | −15% | −28% | 18% | 6% | −20% | −8% | 21% |
| 14 | −16% | 13% | −8% | −3% | 0% | −7% | −1% | −8% | −2% |
| 15 | −10% | −7% | 7% | −3% | −19% | −12% | −26% | −1% | −6% |
| 16 | −16% | 9% | 14% | 5% | −9% | 1% | 2% | −15% | 48% |
| 17 | 10% | −3% | −8% | 11% | −5% | 4% | 31% | −1% | −19% |

Table 3 presents iron amounts (ppm) in the plane at the ½ thickness of the whole thickness direction of the target.

TABLE 3

| Material | Example 1 Ti | Example 2 Ta | Example 3 Ni | Example 4 Ti | Example 5 Ti | Comp. Example 1 Ti | Comp. Example 2 Ta | Comp. Example 3 Ni | Comp. Example 4 Ti |
|---|---|---|---|---|---|---|---|---|---|
| 1 | 4.9 | 0.22 | 1.4 | 5.0 | 3.1 | 6.8 | 0.21 | 1.5 | 8.0 |
| 2 | 4.2 | 0.3 | 1.4 | 4.7 | 3.4 | 4.7 | 0.39 | 1.4 | 6.7 |
| 3 | 4.5 | 0.27 | 1.3 | 5.5 | 5.4 | 4.4 | 0.43 | 1.2 | 9.4 |
| 4 | 5.0 | 0.27 | 1.5 | 5.7 | 4.7 | 4.9 | 0.34 | 1.3 | 7.7 |
| 5 | 5.5 | 0.24 | 1.4 | 5.3 | 4.0 | 5.2 | 0.32 | 1.4 | 7.5 |
| 6 | 5.6 | 0.22 | 1.3 | 4.3 | 4.0 | 5.9 | 0.29 | 1.3 | 10.5 |
| 7 | 4.1 | 0.24 | 1.2 | 5.7 | 5.2 | 5.4 | 0.32 | 1.3 | 7.7 |
| 8 | 4.4 | 0.2 | 1.5 | 4.0 | 4.7 | 3.7 | 0.3 | 1.5 | 7.2 |
| 9 | 5.4 | 0.28 | 1.4 | 5.2 | 4.8 | 6.0 | 0.29 | 1.3 | 10.3 |
| 10 | 4.5 | 0.29 | 1.2 | 5.3 | 4.9 | 5.2 | 0.35 | 1.5 | 8.0 |
| 11 | 5.5 | 0.27 | 1.4 | 5.2 | 4.7 | 5.0 | 0.32 | 1.5 | 7.7 |
| 12 | 5.9 | 0.23 | 1.3 | 5.3 | 4.8 | 5.0 | 0.30 | 1.6 | 7.2 |
| 13 | 5.1 | 0.29 | 1.3 | 4.2 | 4.8 | 4.4 | 0.26 | 1.3 | 12.3 |
| 14 | 5.8 | 0.27 | 1.4 | 3.8 | 4.7 | 4.1 | 0.29 | 1.4 | 8.3 |
| 15 | 6.0 | 0.25 | 1.5 | 3.4 | 5.1 | 5.6 | 0.26 | 1.3 | 8.5 |
| 16 | 5.6 | 0.29 | 1.4 | 4.2 | 4.8 | 6.6 | 0.31 | 1.4 | 13.2 |
| 17 | 5.3 | 0.26 | 1.5 | 4.9 | 4.5 | 6.7 | 0.36 | 1.6 | 6.9 |
| ave. | 5.1 | 0.26 | 1.4 | 4.8 | 4.6 | 5.3 | 0.31 | 1.4 | 8.7 |

Table 4 presents a ratio (%) of a value equal to the iron amount at each of the positions from which an overall average value of the iron amount is subtracted, to the overall average value, in the plane at the ½ thickness of the whole thickness direction of the target.

TABLE 4

| Material | Example 1 Ti | Example 2 Ta | Example 3 Ni | Example 4 Ti | Example 5 Ti | Comp. Example 1 Ti | Comp. Example 2 Ta | Comp. Example 3 Ni | Comp. Example 4 Ti |
|---|---|---|---|---|---|---|---|---|---|
| 1 | −5% | −15% | 2% | 4% | −32% | 29% | −33% | 7% | −8% |
| 2 | −18% | 16% | 2% | −2% | −26% | −11% | 24% | 0% | −23% |
| 3 | −12% | 5% | −6% | 14% | 18% | −17% | 37% | −14% | 9% |
| 4 | −3% | 5% | 9% | 19% | 3% | −7% | 8% | −7% | −11% |
| 5 | 7% | −7% | 2% | 10% | −12% | −1% | 2% | 0% | −13% |
| 6 | 9% | −15% | −6% | −11% | −12% | 12% | −8% | −7% | 21% |
| 7 | −20% | −7% | −13% | 19% | 14% | 2% | 2% | −7% | −11% |
| 8 | −14% | −23% | 9% | −17% | 3% | −30% | −4% | 7% | −17% |
| 9 | 5% | 8% | 2% | 8% | 5% | 14% | −8% | −7% | 19% |
| 10 | −12% | 12% | −13% | 10% | 7% | −1% | 11% | 7% | −8% |
| 11 | 7% | 5% | 2% | 8% | 3% | −5% | 2% | 7% | −11% |
| 12 | 15% | −11% | −6% | 10% | 5% | −5% | −4% | 14% | −17% |
| 13 | −1% | 12% | −6% | −13% | 5% | −17% | −17% | −7% | 42% |
| 14 | 13% | 5% | 2% | −21% | 3% | −22% | −8% | 0% | −4% |
| 15 | 17% | −3% | 9% | −29% | 12% | 6% | −17% | −7% | −2% |
| 16 | 9% | 12% | 2% | −13% | 5% | 25% | −1% | 0% | 53% |
| 17 | 3% | 1% | 9% | 2% | −1% | 27% | 15% | 14% | −20% |

Table 5 presents aluminum amounts (ppm) in the surface of the target.

TABLE 5

| Material | Example 1 Ti | Example 2 Ta | Example 3 Ni | Example 4 Ti | Example 5 Ti | Comp. Example 1 Ti | Comp. Example 2 Ta | Comp. Example 3 Ni | Comp. Example 4 Ti |
|---|---|---|---|---|---|---|---|---|---|
| 1 | 0.6 | 0.02 | 0.01 | 1.0 | 1.1 | 1.6 | 0.04 | 0.03 | 9.7 |
| 2 | 1.1 | 0.04 | 0.02 | 0.9 | 1.2 | 1.2 | 0.05 | 0.04 | 10.7 |
| 3 | 0.8 | 0.04 | 0.02 | 0.6 | 1.2 | 0.8 | 0.06 | 0.02 | 10.6 |
| 4 | 1.1 | 0.03 | 0.02 | 1.0 | 0.8 | 1.0 | 0.02 | 0.03 | 20.2 |
| 5 | 1.1 | 0.04 | 0.01 | 0.7 | 0.7 | 0.9 | 0.03 | 0.04 | 11.5 |
| 6 | 1.1 | 0.02 | 0.01 | 0.8 | 0.8 | 1.0 | 0.02 | 0.02 | 11.6 |
| 7 | 1.3 | 0.02 | 0.02 | 1.0 | 1.2 | 0.6 | 0.01 | 0.03 | 10.8 |
| 8 | 1.2 | 0.03 | 0.01 | 1.1 | 0.9 | 1.4 | 0.05 | 0.03 | 14.5 |
| 9 | 1.0 | 0.02 | 0.01 | 0.9 | 0.7 | 1.7 | 0.04 | 0.04 | 10.4 |
| 10 | 1.0 | 0.04 | 0.02 | 0.7 | 1.0 | 1.2 | 0.05 | 0.03 | 17.3 |
| 11 | 0.9 | 0.03 | 0.02 | 0.8 | 0.7 | 1.2 | 0.05 | 0.02 | 12.0 |
| 12 | 0.7 | 0.02 | 0.02 | 1.3 | 0.9 | 1.0 | 0.02 | 0.03 | 10.0 |
| 13 | 0.9 | 0.01 | 0.02 | 1.0 | 0.7 | 1.0 | 0.03 | 0.02 | 11.4 |
| 14 | 0.8 | 0.03 | 0.01 | 1.2 | 0.9 | 1.2 | 0.04 | 0.01 | 10.3 |
| 15 | 0.7 | 0.04 | 0.02 | 1.1 | 1.1 | 1.7 | 0.05 | 0.02 | 11.4 |
| 16 | 0.8 | 0.04 | 0.02 | 1.2 | 0.6 | 1.3 | 0.02 | 0.03 | 12.3 |
| 17 | 1.0 | 0.03 | 0.01 | 0.9 | 0.7 | 1.3 | 0.01 | 0.02 | 10.3 |
| ave. | 0.9 | 0.03 | 0.02 | 1.0 | 0.9 | 1.2 | 0.03 | 0.03 | 12.1 |

Table 6 presents a ratio (%) of a value equal to the aluminum amount at each of the positions from which an overall average value of the aluminum amount is subtracted, to the overall average value, in the surface of the target.

TABLE 6

| Material | Example 1 Ti | Example 2 Ta | Example 3 Ni | Example 4 Ti | Example 5 Ti | Comp. Example 1 Ti | Comp. Example 2 Ta | Comp. Example 3 Ni | Comp. Example 4 Ti |
|---|---|---|---|---|---|---|---|---|---|
| 1 | −37% | −32% | −37% | 5% | 23% | 35% | 15% | 11% | −20% |
| 2 | 16% | 36% | 26% | −6% | 34% | 1% | 44% | 48% | −11% |
| 3 | −16% | 36% | 26% | −37% | 34% | −32% | 73% | −26% | −12% |
| 4 | 16% | 2% | 26% | 5% | −11% | −15% | −42% | 11% | 68% |
| 5 | 16% | 36% | −37% | −27% | −22% | −24% | −14% | 48% | −5% |
| 6 | 16% | −32% | −37% | −16% | −11% | −15% | −42% | −26% | −4% |
| 7 | 37% | −32% | 26% | 5% | 34% | −49% | −71% | 11% | −10% |
| 8 | 27% | 2% | −37% | 15% | 1% | 18% | 44% | 11% | 20% |
| 9 | 6% | −32% | −37% | −6% | −22% | 44% | 15% | 48% | −14% |
| 10 | 6% | 36% | 26% | −27% | 12% | 1% | 44% | 11% | 43% |
| 11 | −5% | 2% | 26% | −16% | −22% | 1% | 44% | −26% | 0% |
| 12 | −26% | −32% | 26% | 36% | 1% | −15% | −42% | 11% | −17% |

TABLE 6-continued

| Material | Example 1 Ti | Example 2 Ta | Example 3 Ni | Example 4 Ti | Example 5 Ti | Comp. Example 1 Ti | Comp. Example 2 Ta | Comp. Example 3 Ni | Comp. Example 4 Ti |
|---|---|---|---|---|---|---|---|---|---|
| 13 | −5% | −66% | 26% | 5% | −22% | −15% | −14% | −26% | −5% |
| 14 | −16% | 2% | −37% | 26% | 1% | 1% | 15% | −63% | −15% |
| 15 | −26% | 36% | 26% | 15% | 23% | 44% | 44% | −26% | −5% |
| 16 | −16% | 36% | 26% | 26% | −33% | 10% | −42% | 11% | 2% |
| 17 | 6% | 2% | −37% | −6% | −22% | 10% | −71% | −26% | −15% |

Table 7 presents aluminum amounts (ppm) in the plane at the ½ thickness of the whole thickness direction of the target.

TABLE 7

| Material | Example 1 Ti | Example 2 Ta | Example 3 Ni | Example 4 Ti | Example 5 Ti | Comp. Example 1 Ti | Comp. Example 2 Ta | Comp. Example 3 Ni | Comp. Example 4 Ti |
|---|---|---|---|---|---|---|---|---|---|
| 1 | 0.9 | 0.02 | 0.02 | 0.8 | 0.9 | 1.7 | 0.04 | 0.03 | 10.1 |
| 2 | 0.7 | 0.03 | 0.02 | 0.8 | 0.8 | 1.2 | 0.06 | 0.04 | 10.9 |
| 3 | 1.2 | 0.03 | 0.01 | 1.1 | 0.9 | 1.3 | 0.05 | 0.03 | 11.3 |
| 4 | 0.9 | 0.04 | 0.02 | 1.0 | 1.0 | 1.5 | 0.03 | 0.02 | 19.3 |
| 5 | 1.3 | 0.04 | 0.02 | 1.1 | 1.1 | 0.8 | 0.04 | 0.03 | 10.7 |
| 6 | 0.8 | 0.03 | 0.02 | 1.0 | 0.9 | 1.3 | 0.03 | 0.04 | 10.5 |
| 7 | 1.1 | 0.02 | 0.01 | 0.9 | 1.0 | 1.4 | 0.02 | 0.03 | 11.2 |
| 8 | 1.3 | 0.03 | 0.02 | 1.1 | 0.8 | 1.3 | 0.05 | 0.02 | 13.6 |
| 9 | 1.0 | 0.02 | 0.02 | 0.7 | 0.9 | 1.5 | 0.03 | 0.03 | 11.4 |
| 10 | 1.1 | 0.03 | 0.02 | 0.9 | 0.9 | 0.9 | 0.04 | 0.03 | 16.8 |
| 11 | 1.1 | 0.03 | 0.01 | 1.1 | 0.8 | 1.1 | 0.05 | 0.02 | 11.9 |
| 12 | 1.0 | 0.04 | 0.02 | 1.0 | 0.8 | 0.7 | 0.03 | 0.03 | 9.6 |
| 13 | 1.0 | 0.03 | 0.02 | 0.9 | 0.8 | 0.8 | 0.02 | 0.04 | 10.1 |
| 14 | 0.9 | 0.04 | 0.02 | 0.9 | 0.9 | 1.0 | 0.04 | 0.02 | 11.5 |
| 15 | 1.0 | 0.03 | 0.01 | 0.8 | 0.9 | 1.6 | 0.05 | 0.02 | 11.0 |
| 16 | 0.9 | 0.02 | 0.02 | 0.9 | 0.7 | 1.2 | 0.03 | 0.03 | 10.5 |
| 17 | 0.8 | 0.04 | 0.02 | 0.7 | 0.9 | 1.1 | 0.02 | 0.03 | 10.7 |
| ave. | 1.00 | 0.03 | 0.02 | 0.92 | 0.88 | 1.20 | 0.04 | 0.03 | 11.83 |

Table 8 presents a ratio (%) of a value equal to the aluminum amount at each of the positions from which an overall average value of the aluminum amount is subtracted, to the overall average value, in the plane at the ½ thickness of the whole thickness direction of the target.

TABLE 8

| Material | Example 1 Ti | Example 2 Ta | Example 3 Ni | Example 4 Ti | Example 5 Ti | Comp. Example 1 Ti | Comp. Example 2 Ta | Comp. Example 3 Ni | Comp. Example 4 Ti |
|---|---|---|---|---|---|---|---|---|---|
| 1 | −10% | −35% | 13% | −13% | 2% | 42% | 8% | 4% | −15% |
| 2 | −30% | −2% | 13% | −13% | −9% | 0% | 62% | 39% | −8% |
| 3 | 20% | −2% | −43% | 19% | 2% | 8% | 35% | 4% | −4% |
| 4 | −10% | 31% | 13% | 8% | 13% | 25% | −19% | −31% | 63% |
| 5 | 30% | 31% | 13% | 19% | 25% | −33% | 8% | 4% | −10% |
| 6 | −20% | −2% | 13% | 8% | 2% | 8% | −19% | 39% | −11% |
| 7 | 10% | −35% | −43% | −3% | 13% | 17% | −46% | 4% | −5% |
| 8 | 30% | −2% | 13% | 19% | −9% | 8% | 35% | −31% | 15% |
| 9 | 0% | −35% | 13% | −24% | 2% | 25% | −19% | 4% | −4% |
| 10 | 10% | −2% | 13% | −3% | 2% | −25% | 8% | 4% | 42% |
| 11 | 10% | −2% | −43% | 19% | −9% | −8% | 35% | −31% | 1% |
| 12 | 0% | 31% | 13% | 8% | −9% | −42% | −19% | 4% | −19% |
| 13 | 0% | −2% | 13% | −3% | −9% | −33% | −46% | 39% | −15% |
| 14 | −10% | 31% | 13% | −3% | 2% | −17% | 8% | −31% | −3% |
| 15 | 0% | −2% | −43% | −13% | 2% | 33% | 35% | −31% | −7% |
| 16 | −10% | −35% | 13% | −3% | −21% | 0% | −19% | 4% | −11% |
| 17 | −20% | 31% | 13% | −24% | 2% | −8% | −46% | 4% | −10% |

Table 9 presents copper amounts (ppm) in the surface of the target.

TABLE 9

| Material | Example 1 Ti | Example 2 Ta | Example 3 Ni | Example 4 Ti | Example 5 Ti | Comp. Example 1 Ti | Comp. Example 2 Ta | Comp. Example 3 Ni | Comp. Example 4 Ti |
|---|---|---|---|---|---|---|---|---|---|
| 1 | 0.2 | 0.18 | 1.1 | 0.2 | 0.2 | 0.3 | 0.22 | 1.4 | 5.2 |
| 2 | 0.3 | 0.24 | 1.2 | 0.3 | 0.2 | 0.1 | 0.23 | 1.5 | 4.2 |
| 3 | 0.2 | 0.19 | 1.3 | 0.1 | 0.3 | 0.2 | 0.19 | 1.5 | 3.9 |
| 4 | 0.2 | 0.21 | 1.2 | 0.3 | 0.1 | 0.3 | 0.2 | 1.4 | 6.0 |
| 5 | 0.2 | 0.19 | 1.4 | 0.2 | 0.3 | 0.3 | 0.18 | 1.6 | 4.4 |
| 6 | 0.1 | 0.25 | 1.3 | 0.2 | 0.3 | 0.3 | 0.25 | 1.3 | 5.1 |
| 7 | 0.3 | 0.23 | 1.2 | 0.3 | 0.2 | 0.3 | 0.4 | 1.4 | 3.6 |
| 8 | 0.2 | 0.16 | 1.4 | 0.3 | 0.2 | 0.2 | 0.21 | 1.5 | 4.5 |
| 9 | 0.3 | 0.17 | 1.3 | 0.2 | 0.2 | 0.1 | 0.17 | 1.3 | 3.3 |
| 10 | 0.3 | 0.21 | 1.4 | 0.2 | 0.2 | 0.2 | 0.19 | 1.2 | 4.1 |
| 11 | 0.2 | 0.19 | 1.5 | 0.3 | 0.1 | 0.3 | 0.26 | 1.4 | 3.9 |
| 12 | 0.3 | 0.19 | 1.3 | 0.2 | 0.2 | 0.2 | 0.23 | 1.5 | 3.7 |
| 13 | 0.3 | 0.22 | 1.3 | 0.2 | 0.2 | 0.5 | 0.19 | 1.5 | 4.5 |
| 14 | 0.2 | 0.22 | 1.3 | 0.1 | 0.3 | 0.4 | 0.2 | 1.4 | 3.9 |
| 15 | 0.2 | 0.20 | 1.2 | 0.2 | 0.2 | 0.1 | 0.17 | 1.3 | 3.6 |
| 16 | 0.2 | 0.20 | 1.4 | 0.2 | 0.3 | 0.2 | 0.18 | 1.5 | 4.3 |
| 17 | 0.2 | 0.19 | 1.4 | 0.2 | 0.2 | 0.4 | 0.16 | 1.6 | 4.7 |
| ave. | 0.23 | 0.20 | 1.31 | 0.22 | 0.22 | 0.26 | 0.21 | 1.43 | 4.29 |

Table 10 presents a ratio (%) of a value equal to the copper amount at each of the positions from which an overall average value of the copper amount is subtracted, to the overall average value, in the surface of the target.

TABLE 10

| Material | Example 1 Ti | Example 2 Ta | Example 3 Ni | Example 4 Ti | Example 5 Ti | Comp. Example 1 Ti | Comp. Example 2 Ta | Comp. Example 3 Ni | Comp. Example 4 Ti |
|---|---|---|---|---|---|---|---|---|---|
| 1 | −13% | −11% | −16% | −8% | −8% | 16% | 3% | −2% | 21% |
| 2 | 31% | 19% | −8% | 38% | −8% | −61% | 8% | 5% | −2% |
| 3 | −13% | −6% | 0% | −54% | 38% | −23% | −11% | 5% | −9% |
| 4 | −13% | 4% | −8% | 38% | −54% | 16% | −6% | −2% | 40% |
| 5 | −13% | −6% | 7% | −8% | 38% | 16% | −16% | 12% | 3% |
| 6 | −56% | 24% | 0% | −8% | 38% | 16% | 17% | −9% | 19% |
| 7 | 31% | 14% | −8% | 38% | −8% | 16% | 87% | −2% | −16% |
| 8 | −13% | −21% | 7% | 38% | −8% | −23% | −2% | 5% | 5% |
| 9 | 31% | −16% | 0% | −8% | −8% | −61% | −20% | −9% | −23% |
| 10 | 31% | 4% | 7% | −8% | −8% | −23% | −11% | −16% | −4% |
| 11 | −13% | −6% | 15% | 38% | −54% | 16% | 22% | −2% | −9% |
| 12 | 31% | −6% | 0% | −8% | −8% | −23% | 8% | 5% | −14% |
| 13 | 31% | 9% | 0% | −8% | −8% | 93% | −11% | 5% | 5% |
| 14 | −13% | 9% | 0% | −54% | 38% | 55% | −6% | −2% | −9% |
| 15 | −13% | −1% | −8% | −8% | −8% | −61% | −20% | −9% | −16% |
| 16 | −13% | −1% | 7% | −8% | 38% | −23% | −16% | 5% | 0% |
| 17 | −13% | −6% | 7% | −8% | −8% | 55% | −25% | 12% | 10% |

Table 11 presents copper amounts (ppm) in the plane at the ½ thickness of the whole thickness direction of the target.

TABLE 11

| Material | Example 1 Ti | Example 2 Ta | Example 3 Ni | Example 4 Ti | Example 5 Ti | Comp. Example 1 Ti | Comp. Example 2 Ta | Comp. Example 3 Ni | Comp. Example 4 Ti |
|---|---|---|---|---|---|---|---|---|---|
| 1 | 0.3 | 0.22 | 1.2 | 0.2 | 0.3 | 0.2 | 0.19 | 1.4 | 5.4 |
| 2 | 0.2 | 0.21 | 1.3 | 0.2 | 0.2 | 0.1 | 0.2 | 1.4 | 3.8 |
| 3 | 0.3 | 0.2 | 1.3 | 0.2 | 0.3 | 0.2 | 0.18 | 1.5 | 3.9 |
| 4 | 0.2 | 0.18 | 1.2 | 0.2 | 0.2 | 0.3 | 0.25 | 1.3 | 6.5 |
| 5 | 0.3 | 0.18 | 1.4 | 0.2 | 0.2 | 0.3 | 0.23 | 1.5 | 5.0 |
| 6 | 0.2 | 0.21 | 1.3 | 0.2 | 0.3 | 0.2 | 0.23 | 1.4 | 5.3 |
| 7 | 0.2 | 0.23 | 1.4 | 0.2 | 0.2 | 0.3 | 0.35 | 1.4 | 4.0 |
| 8 | 0.3 | 0.19 | 1.5 | 0.2 | 0.3 | 0.1 | 0.22 | 1.6 | 4.8 |
| 9 | 0.2 | 0.2 | 1.2 | 0.2 | 0.2 | 0.2 | 0.21 | 1.4 | 4.0 |
| 10 | 0.2 | 0.18 | 1.3 | 0.2 | 0.2 | 0.4 | 0.18 | 1.4 | 3.9 |
| 11 | 0.1 | 0.21 | 1.4 | 0.2 | 0.1 | 0.1 | 0.24 | 1.3 | 4.1 |
| 12 | 0.2 | 0.2 | 1.3 | 0.2 | 0.2 | 0.3 | 0.21 | 1.6 | 3.9 |
| 13 | 0.2 | 0.21 | 1.2 | 0.1 | 0.2 | 0.4 | 0.2 | 1.4 | 5.1 |
| 14 | 0.3 | 0.23 | 1.4 | 0.2 | 0.3 | 0.4 | 0.23 | 1.3 | 4.2 |
| 15 | 0.2 | 0.19 | 1.2 | 0.2 | 0.2 | 0.3 | 0.2 | 1.6 | 3.9 |

TABLE 11-continued

| Material | Example 1 Ti | Example 2 Ta | Example 3 Ni | Example 4 Ti | Example 5 Ti | Comp. Example 1 Ti | Comp. Example 2 Ta | Comp. Example 3 Ni | Comp. Example 4 Ti |
|---|---|---|---|---|---|---|---|---|---|
| 16 | 0.1 | 0.19 | 1.3 | 0.2 | 0.2 | 0.3 | 0.18 | 1.5 | 4.1 |
| 17 | 0.2 | 0.22 | 1.2 | 0.2 | 0.2 | 0.4 | 0.19 | 1.6 | 5.0 |
| ave. | 0.22 | 0.20 | 1.30 | 0.19 | 0.22 | 0.26 | 0.22 | 1.45 | 4.52 |

Table 12 presents a ratio (%) of a value equal to the copper amount at each of the positions from which an overall average value of the copper amount is subtracted, to the overall average value, in the plane at the ½ thickness of the whole thickness direction of the target.

TABLE 12

| Material | Example 1 Ti | Example 2 Ta | Example 3 Ni | Example 4 Ti | Example 5 Ti | Comp. Example 1 Ti | Comp. Example 2 Ta | Comp. Example 3 Ni | Comp. Example 4 Ti |
|---|---|---|---|---|---|---|---|---|---|
| 1 | 38% | 8% | −8% | 3% | 34% | −24% | −12% | −3% | 19% |
| 2 | −8% | 3% | 0% | 3% | −11% | −62% | −8% | −3% | −16% |
| 3 | 38% | −1% | 0% | 3% | 34% | −24% | −17% | 4% | −14% |
| 4 | −8% | −11% | −8% | 3% | −11% | 13% | 15% | −10% | 44% |
| 5 | 38% | −11% | 8% | 3% | −11% | 13% | 6% | 4% | 11% |
| 6 | −8% | 3% | 0% | 3% | 34% | −24% | 6% | −3% | 17% |
| 7 | −8% | 13% | 8% | 3% | −11% | 13% | 61% | −3% | −12% |
| 8 | 38% | −6% | 15% | 3% | 34% | −62% | 1% | 11% | 6% |
| 9 | −8% | −1% | −8% | 3% | −11% | −24% | −3% | −3% | −12% |
| 10 | −8% | −11% | 0% | 3% | −11% | 51% | −17% | −3% | −14% |
| 11 | −54% | 3% | 8% | 3% | −55% | −62% | 11% | −10% | −9% |
| 12 | −8% | −1% | 0% | 3% | −11% | 13% | −3% | 11% | −14% |
| 13 | −8% | 3% | −8% | −48% | −11% | 51% | −8% | −3% | 13% |
| 14 | 38% | 13% | 8% | 3% | 34% | 51% | 6% | −10% | −7% |
| 15 | −8% | −6% | −8% | 3% | −11% | 13% | −8% | 11% | −14% |
| 16 | −54% | −6% | 0% | 3% | −11% | 13% | −17% | 4% | −9% |
| 17 | −8% | 8% | −8% | 3% | −11% | 51% | −12% | 11% | 11% |

Table 13 presents oxygen amounts (ppm) in the surface of the target.

TABLE 13

| Material | Example 1 Ti | Example 2 Ta | Example 3 Ni | Example 4 Ti | Example 5 Ti | Comp. Example 1 Ti | Comp. Example 2 Ta | Comp. Example 3 Ni | Comp. Example 4 Ti |
|---|---|---|---|---|---|---|---|---|---|
| 1 | 150 | 30 | 30 | 160 | 140 | 190 | 20 | 30 | 320 |
| 2 | 140 | 30 | 20 | 150 | 160 | 180 | 30 | 20 | 300 |
| 3 | 150 | 20 | 20 | 160 | 150 | 170 | 30 | 30 | 350 |
| 4 | 140 | 20 | 30 | 170 | 160 | 190 | 20 | 30 | 480 |
| 5 | 160 | 20 | 30 | 150 | 160 | 190 | 30 | 30 | 310 |
| 6 | 140 | 30 | 30 | 140 | 150 | 180 | 30 | 40 | 390 |
| 7 | 150 | 30 | 30 | 170 | 160 | 170 | 30 | 30 | 380 |
| 8 | 140 | 30 | 20 | 160 | 170 | 180 | 30 | 30 | 400 |
| 9 | 160 | 30 | 30 | 140 | 150 | 190 | 30 | 30 | 330 |
| 10 | 170 | 30 | 20 | 140 | 160 | 150 | 30 | 30 | 340 |
| 11 | 130 | 30 | 20 | 140 | 140 | 180 | 20 | 40 | 380 |
| 12 | 170 | 20 | 30 | 150 | 170 | 160 | 30 | 30 | 310 |
| 13 | 140 | 20 | 30 | 150 | 150 | 160 | 30 | 40 | 510 |
| 14 | 150 | 30 | 30 | 140 | 160 | 170 | 30 | 30 | 300 |
| 15 | 170 | 20 | 30 | 160 | 150 | 170 | 20 | 30 | 410 |
| 16 | 140 | 20 | 20 | 170 | 160 | 170 | 20 | 30 | 390 |
| 17 | 140 | 30 | 30 | 160 | 170 | 190 | 30 | 30 | 350 |
| ave. | 149.41 | 25.88 | 26.47 | 153.53 | 156.47 | 175.88 | 27.06 | 31.18 | 367.65 |

Table 14 presents a ratio (%) of a value equal to the oxygen amount at each of the positions from which an overall average value of the oxygen amount is subtracted, to the overall average value, in the surface of the target.

TABLE 14

| Material | Example 1 Ti | Example 2 Ta | Example 3 Ni | Example 4 Ti | Example 5 Ti | Comp. Example 1 Ti | Comp. Example 2 Ta | Comp. Example 3 Ni | Comp. Example 4 Ti |
|---|---|---|---|---|---|---|---|---|---|
| 1 | 0% | 16% | 13% | 4% | −11% | 8% | −26% | −4% | −13% |
| 2 | −6% | 16% | −24% | −2% | 2% | 2% | 11% | −36% | −18% |
| 3 | 0% | −23% | −24% | 4% | −4% | −3% | 11% | −4% | −5% |
| 4 | −6% | −23% | 13% | 11% | 2% | 8% | −26% | −4% | 31% |
| 5 | 7% | −23% | 13% | −2% | 2% | 8% | 11% | −4% | −16% |
| 6 | −6% | 16% | 13% | −9% | −4% | 2% | 11% | 28% | 6% |
| 7 | 0% | 16% | 13% | 11% | 2% | −3% | 11% | −4% | 3% |
| 8 | −6% | 16% | −24% | 4% | 9% | 2% | 11% | −4% | 9% |
| 9 | 7% | 16% | 13% | −9% | −4% | 8% | 11% | −4% | −10% |
| 10 | 14% | 16% | −24% | −9% | 2% | −15% | 11% | −4% | −8% |
| 11 | −13% | 16% | −24% | −9% | −11% | 2% | −26% | 28% | 3% |
| 12 | 14% | −23% | 13% | −2% | 9% | −9% | 11% | −4% | −16% |
| 13 | −6% | −23% | 13% | −2% | −4% | −9% | 11% | 28% | 39% |
| 14 | 0% | 16% | 13% | −9% | 2% | −3% | 11% | −4% | −18% |
| 15 | 14% | −23% | 13% | 4% | −4% | −3% | −26% | −4% | 12% |
| 16 | −6% | −23% | −24% | 11% | 2% | −3% | −26% | −4% | 6% |
| 17 | −6% | 16% | 13% | 4% | 9% | 8% | 11% | −4% | −5% |

Table 15 presents oxygen amounts (ppm) in the plane at the ½ thickness of the whole thickness direction of the target.

TABLE 15

| Material | Example 1 Ti | Example 2 Ta | Example 3 Ni | Example 4 Ti | Example 5 Ti | Comp. Example 1 Ti | Comp. Example 2 Ta | Comp. Example 3 Ni | Comp. Example 4 Ti |
|---|---|---|---|---|---|---|---|---|---|
| 1 | 120 | 20 | 20 | 180 | 140 | 170 | 30 | 30 | 350 |
| 2 | 160 | 30 | 30 | 140 | 170 | 170 | 30 | 20 | 330 |
| 3 | 120 | 30 | 20 | 120 | 160 | 170 | 30 | 20 | 320 |
| 4 | 130 | 20 | 30 | 110 | 170 | 180 | 20 | 30 | 470 |
| 5 | 100 | 20 | 30 | 140 | 150 | 180 | 30 | 30 | 300 |
| 6 | 130 | 30 | 20 | 180 | 140 | 180 | 30 | 30 | 400 |
| 7 | 100 | 30 | 20 | 170 | 160 | 160 | 30 | 20 | 370 |
| 8 | 130 | 30 | 30 | 160 | 180 | 180 | 20 | 20 | 410 |
| 9 | 180 | 30 | 30 | 160 | 170 | 190 | 30 | 20 | 290 |
| 10 | 180 | 30 | 30 | 160 | 160 | 180 | 20 | 30 | 320 |
| 11 | 120 | 20 | 30 | 130 | 170 | 180 | 30 | 30 | 400 |
| 12 | 170 | 30 | 30 | 160 | 150 | 190 | 30 | 40 | 330 |
| 13 | 160 | 20 | 30 | 190 | 160 | 150 | 20 | 30 | 500 |
| 14 | 170 | 30 | 20 | 170 | 180 | 190 | 30 | 20 | 320 |
| 15 | 150 | 30 | 30 | 160 | 130 | 170 | 30 | 20 | 400 |
| 16 | 170 | 20 | 30 | 160 | 150 | 180 | 30 | 30 | 400 |
| 17 | 160 | 20 | 20 | 150 | 170 | 190 | 30 | 30 | 370 |
| ave. | 144.12 | 25.88 | 26.47 | 155.29 | 159.41 | 177.06 | 27.65 | 26.47 | 369.41 |

Table 16 presents a ratio (%) of a value equal to the oxygen amount at each of the positions from which an overall average value of the oxygen amount is subtracted, to the overall average value, in the plane at the ½ thickness of the whole thickness direction of the target.

TABLE 16

| Material | Example 1 Ti | Example 2 Ta | Example 3 Ni | Example 4 Ti | Example 5 Ti | Comp. Example 1 Ti | Comp. Example 2 Ta | Comp. Example 3 Ni | Comp. Example 4 Ti |
|---|---|---|---|---|---|---|---|---|---|
| 1 | −17% | −23% | −24% | 16% | −12% | −4% | 9% | 13% | −5% |
| 2 | 11% | 16% | 13% | −10% | 7% | −4% | 9% | −24% | −11% |
| 3 | −17% | 16% | −24% | −23% | 0% | −4% | 9% | −24% | −13% |
| 4 | −10% | −23% | 13% | −29% | 7% | 2% | −28% | 13% | 27% |
| 5 | −31% | −23% | 13% | −10% | −6% | 2% | 9% | 13% | −19% |
| 6 | −10% | 16% | −24% | 16% | −12% | 2% | 9% | 13% | 8% |
| 7 | −31% | 16% | −24% | 9% | 0% | −10% | 9% | −24% | 0% |
| 8 | −10% | 16% | 13% | 3% | 13% | 2% | −28% | −24% | 11% |
| 9 | 25% | 16% | 13% | 3% | 7% | 7% | 9% | −24% | −21% |

TABLE 16-continued

| Material | Example 1<br>Ti | Example 2<br>Ta | Example 3<br>Ni | Example 4<br>Ti | Example 5<br>Ti | Comp. Example 1<br>Ti | Comp. Example 2<br>Ta | Comp. Example 3<br>Ni | Comp. Example 4<br>Ti |
|---|---|---|---|---|---|---|---|---|---|
| 10 | 25% | 16% | 13% | 3% | 0% | 2% | −28% | 13% | −13% |
| 11 | −17% | −23% | 13% | −16% | 7% | 2% | 9% | 13% | 8% |
| 12 | 18% | 16% | 13% | 3% | −6% | 7% | 9% | 51% | −11% |
| 13 | 11% | −23% | 13% | 22% | 0% | −15% | −28% | 13% | 35% |
| 14 | 18% | 16% | −24% | 9% | 13% | 7% | 9% | −24% | −13% |
| 15 | 4% | 16% | 13% | 3% | −18% | −4% | 9% | −24% | 8% |
| 16 | 18% | −23% | 13% | 3% | −6% | 2% | 9% | 13% | 8% |
| 17 | 11% | −23% | −24% | −3% | 7% | 7% | 9% | 13% | 0% |

Table 17 presents the order of the peak intensities in the major planes (first crystal plane, second crystal plane, and third crystal plane) in the X-ray diffraction patterns of the surface of each of the targets.

TABLE 17

| Material | Example 1<br>Ti | Example 2<br>Ta | Example 3<br>Ni | Example 4<br>Ti | Example 5<br>Ti |
|---|---|---|---|---|---|
| 1 | (101) > (002) > (100) | (110) > (211) > (200) | (111) > (200) > (220) | (101) > (002) > (100) | (101) > (002) > (100) |
| 2 | (101) > (002) > (100) | (110) > (211) > (200) | (111) > (200) > (220) | (101) > (002) > (100) | (101) > (002) > (100) |
| 3 | (101) > (002) > (100) | (110) > (211) > (200) | (111) > (200) > (220) | (101) > (002) > (100) | (101) > (002) > (100) |
| 4 | (101) > (002) > (100) | (110) > (211) > (200) | (111) > (200) > (220) | (101) > (002) > (100) | (101) > (002) > (100) |
| 5 | (101) > (002) > (100) | (110) > (211) > (200) | (111) > (200) > (220) | (101) > (002) > (100) | (101) > (002) > (100) |
| 6 | (101) > (002) > (100) | (110) > (211) > (200) | (111) > (200) > (220) | (101) > (002) > (100) | (101) > (002) > (100) |
| 7 | (101) > (002) > (100) | (110) > (211) > (200) | (111) > (200) > (220) | (101) > (002) > (100) | (101) > (002) > (100) |
| 8 | (101) > (002) > (100) | (110) > (211) > (200) | (111) > (200) > (220) | (101) > (002) > (100) | (101) > (002) > (100) |
| 9 | (101) > (002) > (100) | (110) > (211) > (200) | (111) > (200) > (220) | (101) > (002) > (100) | (101) > (002) > (100) |
| 10 | (101) > (002) > (100) | (110) > (211) > (200) | (111) > (200) > (220) | (101) > (002) > (100) | (101) > (002) > (100) |
| 11 | (101) > (002) > (100) | (110) > (211) > (200) | (111) > (200) > (220) | (101) > (002) > (100) | (101) > (002) > (100) |
| 12 | (101) > (002) > (100) | (110) > (211) > (200) | (111) > (200) > (220) | (101) > (002) > (100) | (101) > (002) > (100) |
| 13 | (101) > (002) > (100) | (110) > (211) > (200) | (111) > (200) > (220) | (101) > (002) > (100) | (101) > (002) > (100) |
| 14 | (101) > (002) > (100) | (110) > (211) > (200) | (111) > (200) > (220) | (101) > (002) > (100) | (101) > (002) > (100) |
| 15 | (101) > (002) > (100) | (110) > (211) > (200) | (111) > (200) > (220) | (101) > (002) > (100) | (101) > (002) > (100) |
| 16 | (101) > (002) > (100) | (110) > (211) > (200) | (111) > (200) > (220) | (101) > (002) > (100) | (101) > (002) > (100) |
| 17 | (101) > (002) > (100) | (110) > (211) > (200) | (111) > (200) > (220) | (101) > (002) > (100) | (101) > (002) > (100) |

| Material | Comp. Example 1<br>Ti | Comp. Example 2<br>Ta | Comp. Example 3<br>Ni | Comp. Example 4<br>Ti |
|---|---|---|---|---|
| 1 | (101) > (002) > (100) | (110) > (211) > (200) | (111) > (200) > (220) | (101) > (002) > (100) |
| 2 | (101) > (002) > (100) | (110) > (211) > (200) | (111) > (200) > (220) | (101) > (002) > (100) |
| 3 | (101) > (002) > (100) | (110) > (211) > (200) | (111) > (200) > (220) | (101) > (002) > (100) |
| 4 | (101) > (002) > (100) | (110) > (211) > (200) | (111) > (200) > (220) | (101) > (002) > (100) |
| 5 | (101) > (002) > (100) | (110) > (211) > (200) | (111) > (200) > (220) | (101) > (002) > (100) |
| 6 | (101) > (002) > (100) | (110) > (211) > (200) | (111) > (200) > (220) | (101) > (002) > (100) |
| 7 | (101) > (002) > (100) | (110) > (211) > (200) | (111) > (200) > (220) | (101) > (002) > (100) |
| 8 | (101) > (002) > (100) | (110) > (211) > (200) | (111) > (200) > (220) | (101) > (002) > (100) |
| 9 | (101) > (002) > (100) | (110) > (211) > (200) | (111) > (200) > (220) | (101) > (002) > (100) |
| 10 | (101) > (002) > (100) | (110) > (211) > (200) | (111) > (200) > (220) | (101) > (002) > (100) |
| 11 | (101) > (002) > (100) | (110) > (211) > (200) | (111) > (200) > (220) | (101) > (002) > (100) |
| 12 | (101) > (002) > (100) | (110) > (211) > (200) | (111) > (200) > (220) | (101) > (002) > (100) |
| 13 | (101) > (002) > (100) | (110) > (211) > (200) | (111) > (200) > (220) | (101) > (002) > (100) |
| 14 | (101) > (002) > (100) | (110) > (211) > (200) | (111) > (200) > (220) | (101) > (002) > (100) |
| 15 | (101) > (002) > (100) | (110) > (211) > (200) | (111) > (200) > (220) | (101) > (002) > (100) |
| 16 | (101) > (002) > (100) | (110) > (211) > (200) | (111) > (200) > (220) | (101) > (002) > (100) |
| 17 | (101) > (002) > (100) | (110) > (211) > (200) | (111) > (200) > (220) | (101) > (002) > (100) |

Table 18 presents the order of the peak intensities in the major planes (first crystal plane, second crystal plane, and third crystal plane) in the X-ray diffraction patterns of the plane at the ½ position of the whole thickness of each of the targets.

TABLE 18

| Material | Example 1<br>Ti | Example 2<br>Ta | Example 3<br>Ni | Example 4<br>Ti | Example 5<br>Ti |
|---|---|---|---|---|---|
| 1 | (101) > (002) > (100) | (110) > (211) > (200) | (111) > (200) > (220) | (101) > (002) > (100) | (101) > (002) > (100) |
| 2 | (101) > (002) > (100) | (110) > (211) > (200) | (111) > (200) > (220) | (101) > (002) > (100) | (101) > (002) > (100) |
| 3 | (101) > (002) > (100) | (110) > (211) > (200) | (111) > (200) > (220) | (101) > (002) > (100) | (101) > (002) > (100) |
| 4 | (101) > (002) > (100) | (110) > (211) > (200) | (111) > (200) > (220) | (101) > (002) > (100) | (101) > (002) > (100) |

TABLE 18-continued

| | Comp. Example 1<br>Ti | Comp. Example 2<br>Ta | Comp. Example 3<br>Ni | Comp. Example 4<br>Ti |
|---|---|---|---|---|
| 5 | (101) > (002) > (100) | (110) > (211) > (200) | (111) > (200) > (220) | (101) > (002) > (100) |
| 6 | (101) > (002) > (100) | (110) > (211) > (200) | (111) > (200) > (220) | (101) > (002) > (100) |
| 7 | (101) > (002) > (100) | (110) > (211) > (200) | (111) > (200) > (220) | (101) > (002) > (100) |
| 8 | (101) > (002) > (100) | (110) > (211) > (200) | (111) > (200) > (220) | (101) > (002) > (100) |
| 9 | (101) > (002) > (100) | (110) > (211) > (200) | (111) > (200) > (220) | (101) > (002) > (100) |
| 10 | (101) > (002) > (100) | (110) > (211) > (200) | (111) > (200) > (220) | (101) > (002) > (100) |
| 11 | (101) > (002) > (100) | (110) > (211) > (200) | (111) > (200) > (220) | (101) > (002) > (100) |
| 12 | (101) > (002) > (100) | (110) > (211) > (200) | (111) > (200) > (220) | (101) > (002) > (100) |
| 13 | (101) > (002) > (100) | (110) > (211) > (200) | (111) > (200) > (220) | (101) > (002) > (100) |
| 14 | (101) > (002) > (100) | (110) > (211) > (200) | (111) > (200) > (220) | (101) > (002) > (100) |
| 15 | (101) > (002) > (100) | (110) > (211) > (200) | (111) > (200) > (220) | (101) > (002) > (100) |
| 16 | (101) > (002) > (100) | (110) > (211) > (200) | (111) > (200) > (220) | (101) > (002) > (100) |
| 17 | (101) > (002) > (100) | (110) > (211) > (200) | (111) > (200) > (220) | (101) > (002) > (100) |

| Material | Comp. Example 1<br>Ti | Comp. Example 2<br>Ta | Comp. Example 3<br>Ni | Comp. Example 4<br>Ti |
|---|---|---|---|---|
| 1 | (101) > (002) > (100) | (110) > (211) > (200) | (111) > (200) > (220) | (101) > (002) > (100) |
| 2 | (101) > (002) > (100) | (110) > (211) > (200) | (111) > (200) > (220) | (101) > (002) > (100) |
| 3 | (101) > (002) > (100) | (110) > (211) > (200) | (111) > (200) > (220) | (101) > (002) > (100) |
| 4 | (101) > (002) > (100) | (110) > (211) > (200) | (111) > (200) > (220) | (101) > (002) > (100) |
| 5 | (101) > (002) > (100) | (110) > (211) > (200) | (111) > (200) > (220) | (101) > (002) > (100) |
| 6 | (101) > (002) > (100) | (110) > (211) > (200) | (111) > (200) > (220) | (101) > (002) > (100) |
| 7 | (101) > (002) > (100) | (110) > (211) > (200) | (111) > (200) > (220) | (101) > (002) > (100) |
| 8 | (101) > (002) > (100) | (110) > (211) > (200) | (111) > (200) > (220) | (101) > (002) > (100) |
| 9 | (101) > (002) > (100) | (110) > (211) > (200) | (111) > (200) > (220) | (101) > (002) > (100) |
| 10 | (101) > (002) > (100) | (110) > (211) > (200) | (111) > (200) > (220) | (101) > (002) > (100) |
| 11 | (101) > (002) > (100) | (110) > (211) > (200) | (111) > (200) > (220) | (101) > (002) > (100) |
| 12 | (101) > (002) > (100) | (110) > (211) > (200) | (111) > (200) > (220) | (101) > (002) > (100) |
| 13 | (101) > (002) > (100) | (110) > (211) > (200) | (111) > (200) > (220) | (101) > (002) > (100) |
| 14 | (101) > (002) > (100) | (110) > (211) > (200) | (111) > (200) > (220) | (101) > (002) > (100) |
| 15 | (101) > (002) > (100) | (110) > (211) > (200) | (111) > (200) > (220) | (101) > (002) > (100) |
| 16 | (101) > (002) > (100) | (110) > (211) > (200) | (111) > (200) > (220) | (101) > (002) > (100) |
| 17 | (101) > (002) > (100) | (110) > (211) > (200) | (111) > (200) > (220) | (101) > (002) > (100) |

Comparison between the example 1 and the comparative example 1, between the example 2 and the comparative example 2, and between the example 3 and the comparative example 3 shows that there is almost no difference in the impurity components (iron, aluminum, copper, and oxygen) therebetween. It is seen from this that purity equal to or higher than that of the used target can be achieved in the target fabricated through the melting of the used sputtering target.

Comparison between the example 1 and the comparative example 4 shows that the values of the impurity components (iron, aluminum, copper, and oxygen) increase in the comparative example 4. It is seen from this that purity equal to or higher than that of the used sputtering target cannot be achieved in the comparative example 4.

Comparison among the example 1, the example 4, and the example 5 shows that there is no difference in the impurity components (iron, aluminum, copper, and oxygen) among them. It is seen from this that purity equal to or higher than that of the original used sputtering target can be achieved even when the target is manufactured through repeated melting.

Comparison between the examples 1 to 5 and the comparative examples 1 to 4 shows that, in the targets having the same metal component, the first crystal plane, the second crystal plane, and the third crystal plane present the same X-ray diffraction pattern. It is seen from this that the sputtering target manufactured by using the used sputtering target also has random orientation.

What is claimed is:

1. A recycled sputtering target made from at least one selected from the group consisting of a used sputtering target and a scrap material,
the recycled sputtering target comprising:
at least one metal element selected from the group consisting of titanium, zirconium, vanadium, niobium, chromium, molybdenum, tungsten, cobalt, iridium, nickel, palladium and platinum;
oxygen;
iron;
aluminum; and
copper,
wherein the recycled sputtering target is formed by a method comprising:
surface-treating at least one selected from the group consisting of a used sputtering target including a first face and a scrap material including a second face to expose at least one selected from the group consisting of the first and second faces and remove at least one selected from the group consisting of a part of the used sputtering target and a part of the scrap material by 1 mm or more in an inward direction from at least one selected from the group consisting of the first and second faces, the used sputtering target and the scrap material each containing the at least one metal element selected from the group consisting of titanium, zirconium, vanadium, niobium, chromium, molybdenum, tungsten, cobalt, iridium, nickel, palladium and platinum, and the first and second faces each having uniform metallic color;

melting the at least one selected from the group consisting of the used sputtering target and the scrap material after the surface treatment to form an ingot; and forming the recycled sputtering target by subjecting the ingot to forging, rolling, heat treating, and machining, wherein the at least one selected from the group consisting of the used sputtering target and the scrap material is surface-treated by at least one selected from the group consisting of a pickling removal and a mechanical removal, the pickling removal being performed using a mixture containing at least two acids selected from the group consisting of hydrofluoric acid, nitric acid, hydrochloric acid, and acetic acid, wherein the at least one selected from the group consisting of the used sputtering target and the scrap material is melted using at least one melting method selected from the group consisting of electron-beam melting, plasma-arc melting, and cold crucible induction melting, wherein the oxygen satisfies that oxygen amounts in a surface and a thickness direction of the recycled sputtering target are within a range of +30% or less with respect to an average value of an oxygen amount in the entire recycled sputtering target, wherein the iron satisfies that iron amounts in the surface and the thickness direction of the recycled sputtering target are within a range of +30% or less with respect to an average value of an iron amount in the entire recycled sputtering target, wherein the aluminum satisfies that aluminum amounts in the surface and the thickness direction of the recycled sputtering target are within a range of +40% or less with respect to an average value of an aluminum amount in the entire recycled sputtering target, wherein the copper satisfies that copper amounts in the surface and the thickness direction of the recycled sputtering target are within a range of +40% or less with respect to an average value of a copper amount in the entire recycled sputtering target, wherein the oxygen satisfies that oxygen amounts in a surface and a thickness direction of the recycled sputtering target are 200 ppm or less, wherein the iron satisfies that iron amounts in the surface and the thickness direction of the recycled sputtering target are 10 ppm or less, wherein the aluminum satisfies that aluminum amounts in the surface and the thickness direction of the recycled sputtering target are 10 ppm or less, and wherein the copper satisfies that copper amounts in the surface and the thickness direction of the recycled sputtering target are 5 ppm or less.

2. The recycled sputtering target according to claim 1, wherein, in X-ray diffraction patterns obtained from X-ray diffraction measurement in a surface and a thickness direction of the recycled sputtering target, a combination of a first crystal plane having the highest peak intensity, a second crystal plane having the second highest peak intensity, and a third crystal plane having the third highest peak intensity are identical to a combination of the first crystal plane, the second crystal plane, and the third crystal plane in data of Power Diffraction File.

3. The recycled sputtering target according to claim 1, wherein the pickling removal is performed using the mixture containing the hydrofluoric acid having a first mixture ratio and the nitric acid having a second mixture ratio higher than the first mixture ratio.

4. The recycled sputtering target according to claim 1, wherein the at least one selected from the group consisting of the used sputtering target and the scrap material is melted using at least one melting method selected from the group consisting of the electron-beam melting and the cold crucible induction melting under a $1.0 \times 10^{-1}$ Pa degree of vacuum or less.

5. The recycled sputtering target according to claim 1, comprising the titanium.

6. The recycled sputtering target according to claim 1, comprising the nickel.

* * * * *